(12) United States Patent
Shibata et al.

(10) Patent No.: US 7,683,266 B2
(45) Date of Patent: Mar. 23, 2010

(54) CIRCUIT BOARD AND CIRCUIT APPARATUS USING THE SAME

(75) Inventors: Kiyoshi Shibata, Ogaki (JP); Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 753 days.

(21) Appl. No.: 11/494,744

(22) Filed: Jul. 28, 2006

(65) Prior Publication Data

US 2007/0023202 A1 Feb. 1, 2007

(30) Foreign Application Priority Data

| | | |
|---|---|---|
| Jul. 29, 2005 | (JP) | ............................. 2005-220577 |
| Aug. 29, 2005 | (JP) | ............................. 2005-247171 |
| May 23, 2006 | (JP) | ............................. 2006-142272 |

(51) Int. Cl.
*H01R 12/04* (2006.01)
*H05K 1/11* (2006.01)

(52) U.S. Cl. ...................................... 174/262; 174/255

(58) Field of Classification Search ......... 174/262–266, 174/255; 361/792–795
See application file for complete search history.

(56) References Cited

U.S. PATENT DOCUMENTS 6,274,820 B1 * 8/2001 DiStefano et al. ........... 174/254

6,585,903 B1 * 7/2003 Belke et al. ................... 216/13

FOREIGN PATENT DOCUMENTS

| JP | 59-032077 B2 | 8/1984 |
|---|---|---|
| JP | 64-059991 | 3/1989 |
| JP | 2001-207288 | 7/2001 |
| JP | 2003-335057 A | 11/2002 |

* cited by examiner

*Primary Examiner*—Jeremy C Norris
(74) *Attorney, Agent, or Firm*—McDermott Will & Emery LLP

(57) ABSTRACT

A circuit board and a circuit apparatus using the same which can prevent displacement and film exfoliation ascribable to thermal expansion, and suppress a drop in reliability at increasing temperatures. The circuit board of the circuit apparatus includes a metal substrate having pierced holes as a core member. Protrusions are formed on the top ends of the pierced holes, and depressions are formed in the bottom ends of the pierced holes. Wiring pattern layers are formed on both sides of this metal substrate via respective insulating layers. In order to establish electrical connection between the wiring pattern layers, a conductor layer which connects the wiring pattern layers is formed through the metal substrate via the pierced holes. The conductor layer thereby establishes electrical conduction between the wiring pattern layers. Furthermore, a semiconductor chip is directly connected to the surface side of the circuit board via solder balls.

15 Claims, 15 Drawing Sheets

50A

50B

50

50A

50B

100

PRIOR ART

PRIOR ART

200A

PRIOR ART

CIRCUIT BOARD AND CIRCUIT APPARATUS USING THE SAME

BACKGROUND OF THE INVENTION

1. Field of the Invention

The invention relates to a circuit board and a circuit apparatus using the same. In particular, the invention relates to a circuit board having a substrate consisting primarily of metal as a core member, and a circuit apparatus using the same.

2. Description of the Related Art

While portable electronics equipment including cellular phones, PDAs, DVCs, and DSCs are rapidly becoming more functionally sophisticated, miniaturization and weight savings have become essential in order for these products to be accepted in the market. In order to achieve these aims, system LSIs offering higher integration have been sought. Meanwhile, electronic equipment with enhanced usability and convenience have been desired, and a higher level of functional and performance sophistication has been required of the LSIs intended for use in such equipment. Consequently, while the LSI chips providing higher integration have enabled a greater numbers of I/Os to be implemented, miniaturization of the packages themselves has been highly sought after. For the sake of satisfying both of these requirements, there has been strong demand to develop a semiconductor package suited to packaging semiconductor parts on a board at a higher density. To meet this demand, various types of packaging technologies called CSp (Chip Size Package) have been developed.

Among the known examples of such packages is a BGA (Ball Grid Array). With the BGA, semiconductor chips are mounted on the packaging board and molded with resin. Then, solder balls are formed over an area on the opposing side of the board as external terminals. Since the BGA utilizes a planar mounting area, it is relatively easy to miniaturize the package. Further to this, the circuit board need not be rendered in narrower pitches and does not require high-precision mounting technologies. The BGA can thus be used to reduce the total packaging cost, even if the package itself is of a relatively high cost.

FIG. 17 is a diagram showing the general configuration of a typical BGA. The BGA 100 has a structure where an LSI chip 102 is mounted on a glass epoxy board 106 via an adhesive layer 108. The LSI chip 102 is molded within a sealing resin 110. The LSI chip 102 and the glass epoxy board 106 are electrically connected by metal wires 104. Solder balls 112 are arranged in an array on the back side of the glass epoxy board 106. Through these solder balls 112, the BGA 100 is mounted on a printed wiring board.

In recent years, semiconductor packages (circuit apparatuses) for incorporation into electronic equipment and the like have required increased miniaturization, higher densities, and more functionality. The circuit apparatuses have thus increased the heat generation density per unit volume. Such increases in the heat generation density can have an adverse effect on the performance and reliability of the circuit apparatuses, thereby causing significant problems. For this reason, metal substrates and the like having high radiation performances have been used as circuit boards for constituting the circuit apparatuses as an alternative to the glass epoxy board 106.

FIG. 18 is a sectional schematic view showing another structure of a conventional circuit apparatus as disclosed in Japanese Patent Laid-Open Publication No. 2002-335057. With reference to FIG. 18, the circuit board 210 for constituting a conventional circuit apparatus 200 includes a metal substrate 201 as a core member. Wiring pattern layers 203 and 205 are formed on both sides of the metal substrate 201 via resin insulating layers 202 and 204. Through apertures called through holes 206 are formed in the direction of thickness to provide electrical connection between the layers. The inner surfaces of the through holes are plated with copper or the like, thereby forming an electrical conduction layer 207 for layer-to-layer conduction. Further to this, a semiconductor chip 220 is directly connected to one side of the circuit board 210 via solder balls 221.

In general, the metal substrate 201 is made of a metal material that requires a low coefficient of thermal expansion. Conversely, the insulating layer 202 is made of a resin having a high coefficient of thermal expansion. For example, the metal substrate is made of an Fe—Ni—Co alloy having a coefficient of thermal expansion of $10 \times 10^{-6}$/K, or copper (Cu) having a coefficient of thermal expansion of $6 \times 10^{-6}$ to $9 \times 10^{-6}$/K. Meanwhile, the insulating film is made of an epoxy resin having a coefficient of thermal expansion of $60 \times 10^{-6}$ to $70 \times 10^{-6}$/K. That is, the insulating film has a coefficient of thermal expansion approximately ten times that of the metal substrate. Due to such a difference in the thermal expansion property, the wiring pattern layer 203 formed on the insulating layer 202 undergoes displacement as the circuit board 210 rises in temperature. FIG. 19 is a sectional view of the circuit board in which displacement occurs due to a rise in temperature. In the diagram, an electric conductive layer 207a, having no thermal-expansion displacement, is shown by the broken line. As shown in FIG. 19, the distance as much as which the wiring pattern layer 203 formed on the insulating layer 202 is shifted by expansion (the amount of displacement caused by the expansion) is greater than that of the electrical conduction layer 207 which is formed inside the through hole 206 of the metal substrate 201. The two patterns thus cause a relative displacement with respect to one another. If this displacement is repeated due to temperature variations in the circuit board 210, cracks can sometimes occur between the wiring pattern layer 203 and the electrical conduction layer 207. It therefore follows that this portion makes a poor connection, resulting in reduced reliability. Moreover, since the metal substrate 201 and the insulating layer 202 are bonded only by the adhesion of the contact surfaces, problems such as film exfoliation from the metal substrate 201 may occur, depending on the amount of displacement of the expanding insulating layer 202. As a result, the circuit board 210 and the circuit apparatus using the same may bring about deterioration in reliability.

In addition to this, the wiring material used for the circuit board 210 (for example, copper) is typically under compression stress (stress in the direction in which the wiring material contracts), which occurs in the process of formation. Even after the wiring material is patterned into the desired wiring pattern layers 203 and 205, the wiring pattern layers 203 and 205 still have compression stresses (the stresses A and B). The higher wiring densities the wiring pattern layers have, the higher the remaining compression stresses are. As shown in FIG. 18, if the wiring pattern layer 203 formed on one side of the metal substrate 201 has a wiring density higher than that of the wiring pattern layer 205 formed on the other side, the circuit board 210 can be affected by the compression stress acting on the side of the wiring pattern layer 203 (the differential compression stress between the stresses A and B).

FIG. 20 is a sectional view of a circuit apparatus having a deformed circuit board. FIG. 20 shows a case where the compression stress acting on the side of the wiring pattern layer 203 (the differential compression stress between the stresses A and B of FIG. 18) exceeds the rigidity of the circuit board 210 (in particular, the metal substrate 201). Here, the circuit board 210 contracts to warp and deform toward the side of the wiring pattern layer 203. Specifically, the wiring pattern layer 203 and the resin insulating layer 202 undergo a compression stress (the stress in the direction in which the materials contract). The wiring pattern layer 205 and the resin insulating layer 204 on the other side undergo a tensile stress (the stress in the direction in which the materials expand). Consequently, the wiring pattern layers 203 and 205 can easily cause migration of the wiring material, with a resultant drop in the wiring reliability. The resin insulating layers 202 and 204, on the other hand, may possibly cause exfoliation from the metal substrate 201 and the wiring pattern layers. As a whole, the circuit apparatus 200 having the circuit board 210 is susceptible to deterioration in reliability.

SUMMARY OF THE INVENTION

The prevent invention has been achieved in view of the foregoing circumstances. It is therefore an object of the present invention to provide a circuit board and a circuit apparatus using the same which can control a displacement and film exfoliation ascribable to thermal expansion, and suppress a drop in reliability at increasing temperatures.

To achieve the foregoing object, a circuit apparatus according to the present invention includes: a metal substrate having a plurality of pierced holes; a first wiring layer formed on one side of the metal substrate via a first insulating layer; a second wiring layer formed on the other side of the metal substrate via a second insulating layer; a conductor layer formed in at least some of the plurality of pierced holes so as to pierce through the metal substrate via the pierced holes, thereby establishing connection between the first wiring layer and the second wiring layer; and a circuit element connected to the first wiring layer on the one side of the metal substrate, and wherein protrusions are formed on the surface of the metal substrate at least along either one end of each of the pierced holes provided with the conductor layer.

According to this invention, the protrusions formed along the ends of the pierced holes that are provided with the conductor layer exert an anchoring effect to fasten the insulating layers which might expand when the circuit board rises in temperature. It is therefore possible to reduce a pattern shift of the wiring layers ascribable to a difference in the coefficient of thermal expansion between the metal substrate and the insulating layers (or deformation of the conductive layer for connecting the two wiring layers; specifically, displacements between the conductor layer inside the pierced holes of the metal substrate and the connecting points to the first and second wiring layers).

The protrusions formed along the ends of the pierced holes can increase the contact areas between the metal substrate and the insulating layers, providing improved adhesion. This can also reduce exfoliation of the insulating layers from the metal substrate.

As a result, it is possible to prevent the reliability of the circuit apparatus from being reduced at increasing temperatures.

In the foregoing configuration, the pierced holes having the conductor layer are preferably formed in a honeycomb configuration within the area of the metal substrate. Since the protrusions are formed along the ends of the pierced holes which are arranged in a honeycomb configuration, the protrusions are distributed uniformly within the circuit apparatus. The adhesion-improving effect can thus be obtained uniformly from across the circuit apparatus. In addition to this, since the plurality of pierced holes can be arranged with a density higher than in a square grid configuration, the protrusions can provide wide contact areas for an enhanced effect of improved adhesion. As a result, it is possible to more effectively prevent the reliability of the circuit apparatus from being reduced at increasing temperatures.

In the foregoing constitution, it is preferable to form the protrusions more on the surface of the metal substrate on the one side than on the surface of the metal substrate on the other side. It follows that a greater number of protrusions fall on the same side as the circuit element, or heat source. This allows a more significant effect of improved adhesion, thereby effectively preventing the reliability of the circuit apparatus from being reduced at increasing temperatures.

To achieve the foregoing object, another circuit apparatus according to the present invention is characterized in that the protrusions are selectively formed on the surface of the metal substrate on the one side. According to this invention, the protrusions are selectively formed on the same side as the circuit element, or heat source. This makes it possible to provide a more significant effect of improved adhesion.

In the foregoing configuration, the plurality of pierced holes are preferably arranged so that, in plan view, pierced holes not having the conductor layer surround the pierced holes having the conductor layer. Consequently, the expansion of the insulating layer near the pierced holes having the conductor layer can be suppressed further by the protrusions of the pierced holes that are arranged around and are not provided with the conductor layer. It is therefore possible to effectively reduce a pattern shift of the wiring layers in the pierced holes having the conductor layer.

To achieve the foregoing object, a circuit board according to one of the aspects of the present invention includes: a metal substrate having a plurality of pierced holes; a first wiring layer formed on one side of the metal substrate via a first insulating layer; a second wiring layer formed on the other side of the metal substrate via a second insulating layer, with a wiring density lower than that of the first wiring layer; a conductor layer piercing through the metal substrate via the pierced holes, thereby establishing connection between the first wiring layer and the second wiring layer; and protrusions formed on the other side of the metal substrate along the ends of the pierced holes.

According to this aspect, warpage of the circuit board occurring due to a compression stress ascribable to the difference between the wiring densities on the one side and the other side of the metal substrate (a compression stress acting on the one side of the metal substrate) is eased by a tensile stress occurring from a difference in expansion (lateral expansion, in particular) between the insulating layers on the one side and the other side of the metal substrate (a tensile stress acting on the one side of the metal substrate). It is therefore possible to suppress the occurrence of wiring migration and exfoliation of the resin insulating layers, and preclude transportation errors when packaging the circuit element and the like, with an improvement in the reliability of the circuit board.

A circuit board according to another aspect further includes protrusions formed on the one side of the metal substrate along the ends of pierced holes. The number of protrusions on the other side of the metal substrate is greater than the number of protrusions on the one side of the metal substrate. Since the expansion of the insulating layers are suppressed more on the side having a greater number of protrusions, a difference in expansion arises between the insulating layers. Consequently, the one side of the metal substrate undergoes a tensile stress, which can ease the warpage of the circuit board ascribable to the compression stress caused by the difference in wiring density. It is therefore possible to improve the reliability of the circuit board.

A circuit apparatus according to yet another aspect of the present invention includes the forgoing circuit board and a circuit element mounted on the circuit board. The circuit element, or heat source, increases the temperature of the circuit board (circuit apparatus), and thus increases the tensile stress that occurs due to the difference in expansion between the insulating layers on the one side and the other side of the metal substrate. This can reduce the compression stress occurring due to the difference in the wiring density, thereby suppressing warpage and deformation of the circuit board with an improvement in the reliability of the circuit apparatus.

In the foregoing configuration, the circuit element is desirably formed on the first wiring layer, opposite to the protrusions. This makes it easier for the insulating layer closer to the circuit element to expand because of the heat generated by the circuit element. Consequently, the tensile stress that occurs due to the difference in expansion between the insulating layers on the one side and the other side of the metal substrate becomes even higher. As a result, it is further possible to reduce the compression stress occurring due to the difference in the wiring density, whereby warpage of the circuit board can be further suppressed to provide a circuit apparatus of improved reliability.

It is to be noted that any arbitrary combination or rearrangement of the above-described structural components and so forth are all effective as and encompassed by the present embodiments. Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
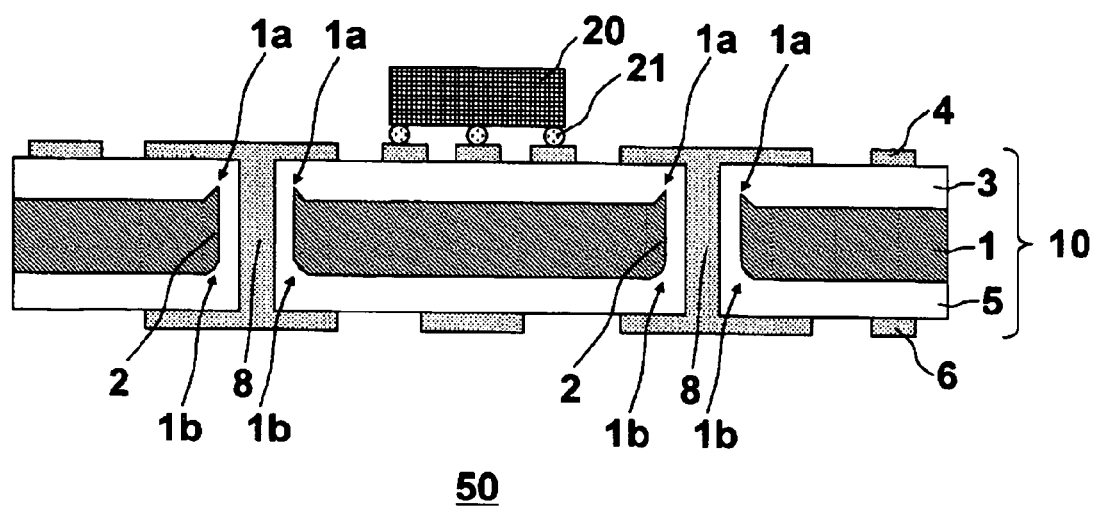
FIG. 1 is a sectional view of a circuit apparatus which has a circuit board including a metal substrate according to a first embodiment of the present invention.

Hereinafter, embodiments for practicing the present invention will described with reference to the drawings. It should be appreciated that in any of the drawings, identical components will be designated by like reference numerals. Description thereof will be omitted as appropriate. As employed herein, the "top" direction shall be defined such that circuit components are arranged on top of a metal substrate.

First Embodiment

FIG. 1 is a sectional view of a circuit apparatus which has a circuit board including a metal substrate according to a first embodiment of the present invention.

According to the first embodiment of the present invention, the circuit apparatus 50 has a circuit board 10 in which a metal substrate 1, having a plurality of pierced holes 2, forms a core member. The metal substrate 1 has protrusions 1a at the top ends of the pierced holes 2, and rounded corners (depressions) 1b at the bottom ends of the pierced holes 2. Wiring pattern layers 4 and 6 are formed on both sides of this metal substrate 1 via insulating layers 3 and 5, respectively. In order to facilitate electrical connection between the wiring pattern layers, a conductor layer 8 for connecting the wiring pattern layer 4 and the wiring pattern layer 6 is formed through the metal substrate 1 via the pierced holes 2. The conductor layer 8 thereby establishes electrical conduction between the wiring pattern layers. An LSI chip 20 is directly connected to the top side of the circuit board 10 via solder balls 21. It should be appreciated that the insulating layer 3 represents the "first insulating layer" of the present invention, the insulating layer 5 the "second insulating layer" of the present invention, the wiring pattern layer 4 the "first wiring layer" of the present invention, and the wiring pattern layer 6 the "second wiring layer" of the present invention.

More specifically, a metal substrate 1 having a thickness of approximately 50 μm to 1 mm (for example, approximately 100 μm) is used as the core member inside the circuit board 10 in the circuit apparatus 50. For example, this metal substrate 1 is made of a cladding material that is formed by laminating the following layers: a lower metal layer of copper; an intermediate metal layer of Fe—Ni alloy (so-called invar alloy) formed on the lower metal layer; and an upper metal layer of copper formed on the intermediate metal layer. It should be appreciated that the metal substrate 1 may be made of a single layer of copper.

Figure 2:
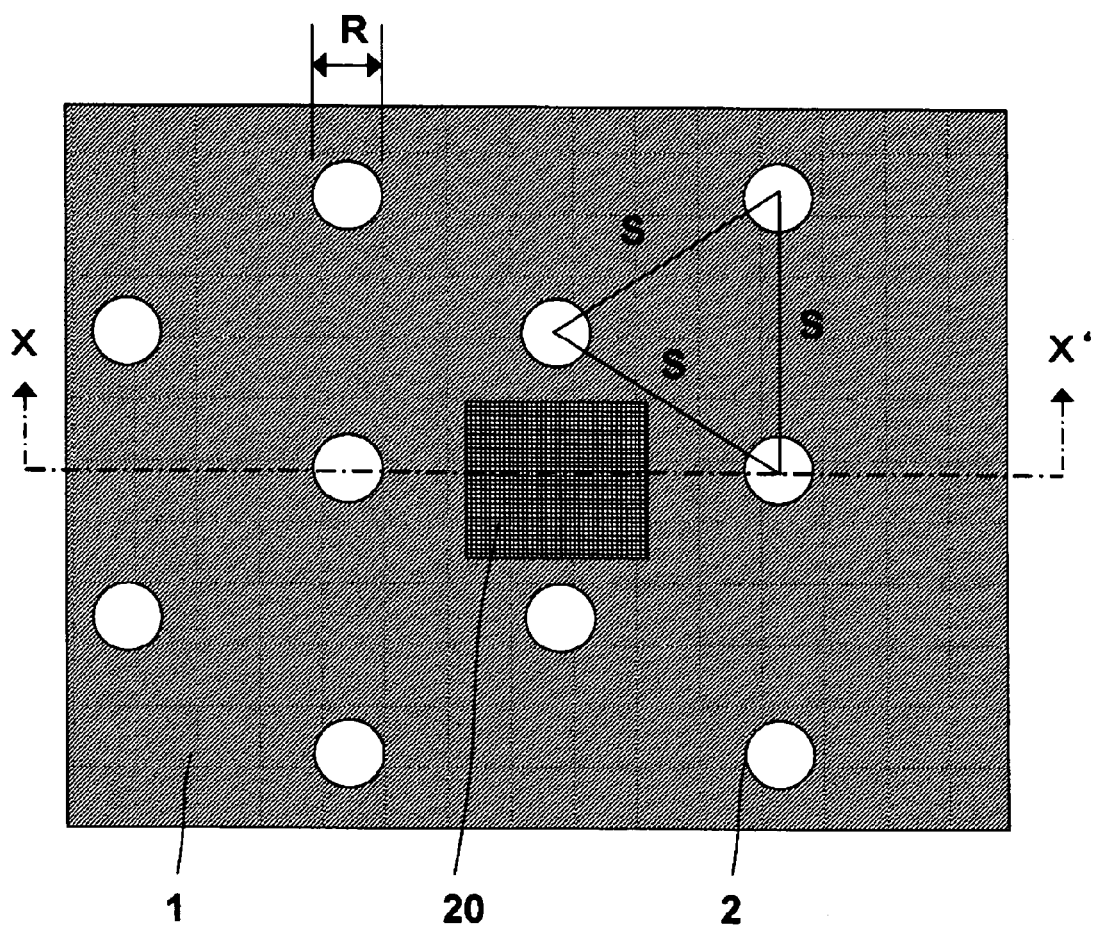
FIG. 2 is a plan view showing the positions of pierced holes formed in the metal substrate of the circuit apparatus shown in FIG. 1.

FIG. 2 is a plan view showing the positions of pierced holes formed in the metal substrate of the circuit apparatus shown in FIG. 1. FIG. 1 corresponds to a sectional view taken along the line X-X' of FIG. 2. The metal substrate 1 is shaped by laser irradiation or drilling from below, so that pierced holes 2 (diameter R: approximately 300 μm) piercing therethrough are formed at predetermined locations corresponding to a honeycomb configuration (an arrangement in which the pierced holes are disposed to the vertexes and centers of regular hexagons). In this embodiment, the metal substrate 1 has ten pierced holes 2 which are arranged so that S=4R, where S is the pitch between the pierced holes. When the pierced holes 2 are thus formed in the metal substrate 1, the protrusions 1a (approximately 25 μm) are formed on the top side of the metal substrate 1 along the ends of the pierced holes 2. The depressions 1b are formed in the bottom side of the metal substrate 1 along the ends of the pierced holes 2. It should be appreciated that while these protrusions 1a are formed along the ends of the pierced holes 2 in the metal substrate 1, the extremities of the protrusions 1a need not be of a uniform height. For example, the extremities may have a comb-like or wave-like shape. It should also be appreciated that the protrusions 1a need not be identical in shape or height, either. Moreover, the protrusions 1a need not always be formed as integral (continuous) annular protrusions along the ends of the pierced holes 2. For example, a plurality of separate protrusions may be formed in a discrete manner along the end of each pierced hole 2.

The insulating layers 3 and 5 on the top side and bottom side of the metal substrate 1 are made primarily of an epoxy resin with a thickness of approximately 60 μm to 160 μm (for example, approximately 75 μm). The pierced holes 2 of the metal substrate 1 are completely filled with the insulating layers 3 and 5. A filler of approximately 2 μm to 10 μm in diameter may be added to the insulating layers 3 and 5, which consist primarily of the epoxy resin. Examples of this filler may include alumina ($Al_2O_3$), silica ($SiO_2$), aluminum nitride (AlN), silicon nitride (SiN), and boron nitride (BN). The filling rate of the filler is approximately 60% to 80% by weight.

The wiring pattern layers 4 and 6 of copper, having a thickness of approximately 35 μm, are formed on the insulating layers 3 and 5, respectively. The conductor layer 8 (approximately 150 μm in diameter) establishes electrical conduction between the wiring pattern layers. The LSI chip 20, or semiconductor chip, is connected onto the wiring pattern layer 4 via the solder balls 21. It should be appreciated that the LSI chip 20 represents the "circuit element" of the present invention.

FIGS. 3A to 5 are sectional views for explaining the manufacturing process of the circuit apparatus including the circuit board, in accordance with the first embodiment of the present invention shown in FIG. 1.

Figure 3A:
FIGS. 3A to 3C are sectional views for explaining the process for manufacturing the circuit apparatus which has the circuit board including the metal substrate according to the first embodiment of the present invention.

Initially, as shown in FIG. 3A, a metal substrate 1, having a thickness of approximately 50 μm to 1 mm (for example, approximately 100 μm), is prepared. For example, the metal substrate 1 is made of a cladding material that is formed by laminating the following layers: a lower metal layer of copper; an intermediate metal layer of Fe—Ni alloy (so-called invar alloy) formed on the lower metal layer; and an upper metal layer of copper formed on the intermediate metal layer. The metal substrate 1 may be made of a single layer of copper.

Figure 3B:
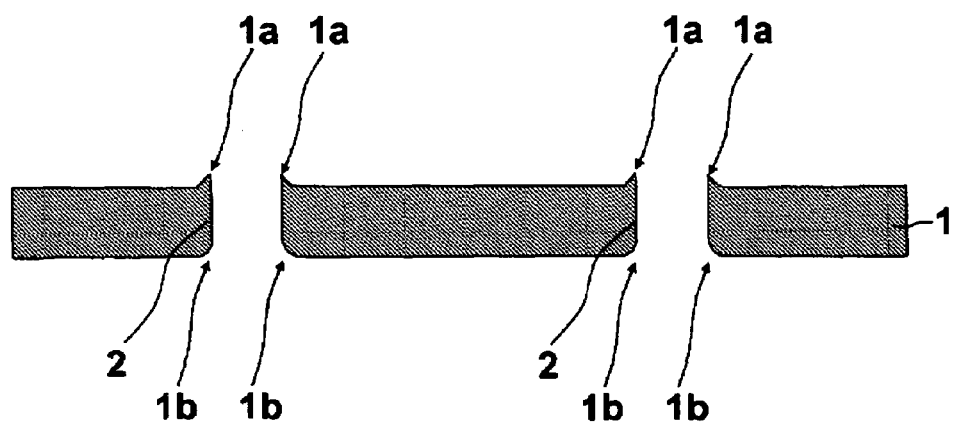

As shown in FIG. 3B, the metal substrate 1 is irradiated with a laser or drilled from below, whereby pierced holes 2 (diameter R: approximately 300 μm) piercing through the metal substrate 1 are formed at predetermined locations corresponding to the honeycomb configuration. The drill-based process for forming the pierced holes 2 will be described later. The arrangement of the pierced holes 2 is the same as described in FIG. 2 above. Consequently, the protrusions 1a (approximately 25 μm) are formed on the metal substrate 1 along the top ends of the pierced holes 2, and the depressions 1b are formed along the bottom ends of the pierced holes 2. It should be appreciated that while these protrusions 1a are formed along the ends of the pierced holes 2 in the metal substrate 1, the extremities of the protrusions 1a need not be of a uniform height. For example, the extremities may have a comb-like or wave-like shape. The protrusions need not be identical in shape or height either. Moreover, the protrusions 1a need not always be formed as integral (continuous) annular protrusions along the ends of the pierced holes 2. For example, a plurality of separate protrusions may be formed in a discrete manner along the end of each pierced hole 2.

Figure 3C:
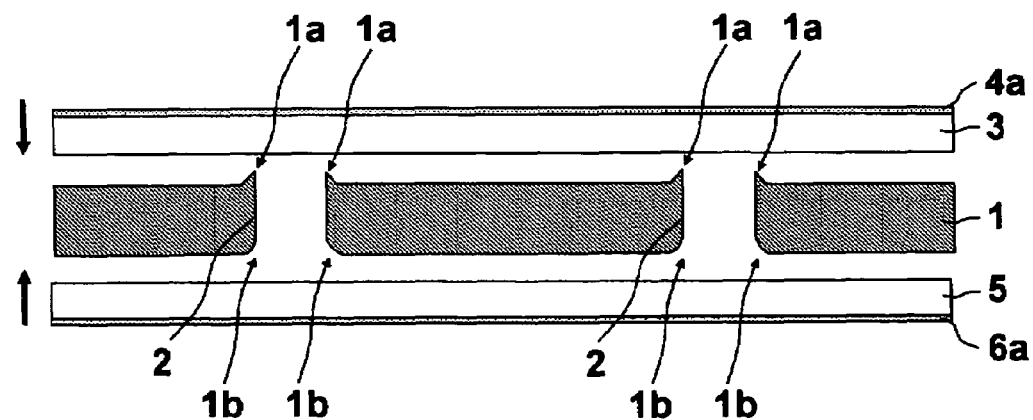

As shown in FIG. 3C, an insulating layer 3 accompanied with a copper foil 4a, and an insulating layer 5 accompanied with a copper foil 6a, are thermocompression bonded to the top side and bottom side of the metal substrate 1, respectively, under vacuum or reduced pressure. For example, the insulating layers 3 and 5 may have a thickness of about 75 μm, and the copper foils 4a and 6a may have a thickness of about 10 to 15 μm.

Figure 4A:
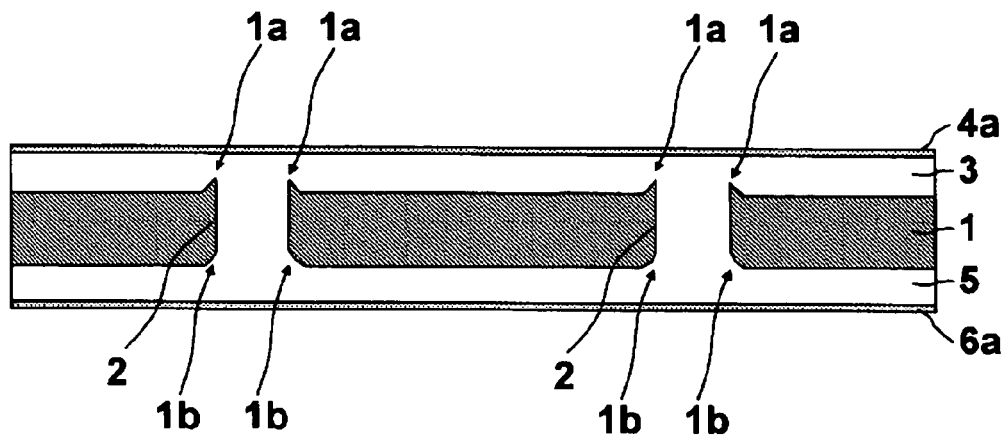
FIGS. 4A to 4C are sectional views for explaining the process for manufacturing the circuit apparatus which has the circuit board including the metal substrate according to the first embodiment of the present invention.

After the compression bonding of the copper-foiled insulating layers, as shown in FIG. 4A, the pierced holes 2 of the metal substrate 1 are completely filled with the insulating layers 3 and 5.

Figure 4B:
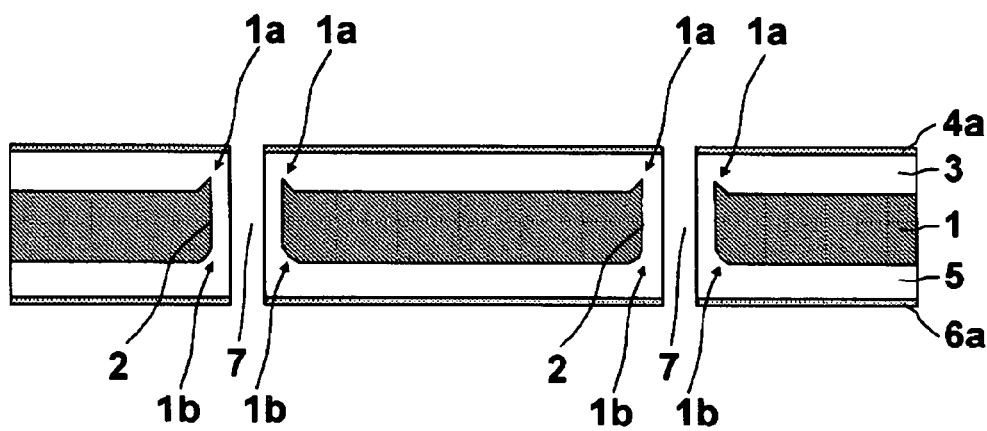

As shown in FIG. 4B, the insulating layer filled into the pierced holes 2 of the metal substrate 1 is subjected to laser irradiation or drilling, so that through holes 7 (approximately 150 μm in diameter), for connecting the copper foils on both sides, are formed through this insulating layer at locations corresponding to the pierced holes 2. In this instance, all the (ten) pierced holes 2 are provided with respective through holes 7.

Figure 4C:
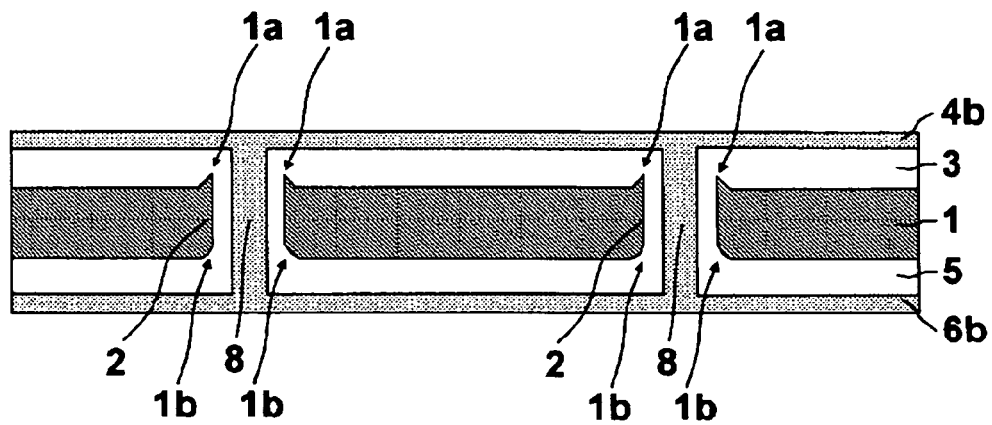

As shown in FIG. 4C, the top surface of the copper foil 4a, the inner surfaces of the through holes 7, and the top surface of the copper foil 6a are plated with approximately 0.5 μm of copper by electroless plating. Subsequently, the top surface of the copper foil 4a, the inner surfaces of the through holes 7, and the top surface of the copper foil 6a are plated by electrolytic plating. In the present embodiment, an inhibitor and a promoter are added to the plating solution so that the inhibitor is absorbed onto the top surfaces of the copper foils 4a and 6a while the promoter is absorbed onto the inner surfaces of the through holes 7. This can increase the thickness of the copper plating on the inner surfaces of the through holes 7, thereby filling the through holes 7 with copper. As a result, wiring layers 4b and 6b of copper, having a thickness of approximately 35 μm, are formed on the insulating layers 3 and 5, respectively, and the through holes 7 are filled with a conductor layer 8 of copper.

Figure 5:
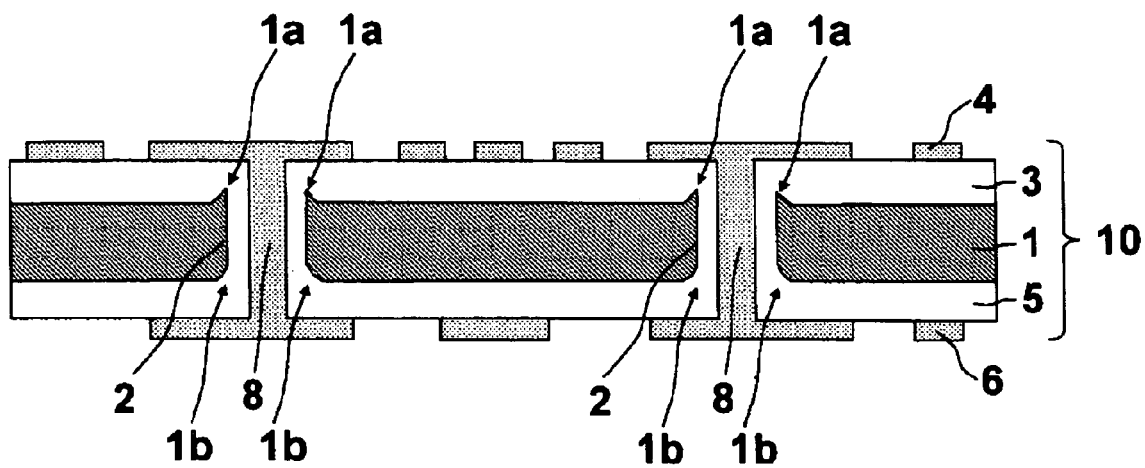
FIG. 5 is a sectional view for explaining the process for manufacturing the circuit apparatus which has the circuit board including the metal substrate according to the first embodiment of the present invention.

Next, as shown in FIG. 5, the wiring layers 4b and 6b are individually patterned using photolithography and etching techniques. This forms the wiring pattern layer 4 and the wiring pattern layer 6. Consequently, the circuit board 10, which includes the metal substrate 1 having the protrusions 1a, is formed.

Finally, as shown in FIG. 1, the LSI chip 20 is mounted on the wiring pattern layer 4 of the circuit board 10 so as to make electrical connection via the solder balls 21. The LSI chip 20 is then fixed with a resin layer (not shown). As a result, the circuit apparatus 50, which includes the circuit board 10 with the metal substrate 1, is formed.

It should be appreciated that the foregoing description made in conjunction with FIG. 2 has dealt with the case where the metal substrate 1 is irradiated with a laser or drilled from below so that the through holes 2 are formed through the metal substrate 1, whereas the method of forming the pierced holes 2 is not limited thereto. For example, the pierced holes 2 may be formed in the metal substrate 1 by the following method.

Figure 6A:
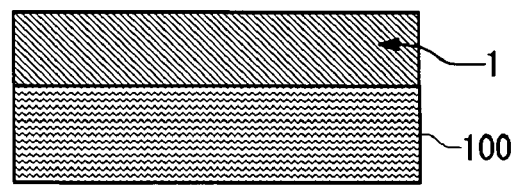
FIGS. 6A to 6D are process charts for showing a technique for forming pierced holes in the metal substrate.

Initially, as shown in FIG. 6A, a control plate 100 is placed on the bottom side of the metal substrate 1, opposite to the drill-in surface.

Figure 6B:
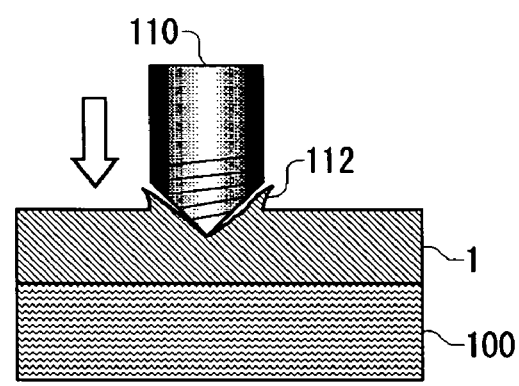

Next, as shown in FIG. 6B, the metal substrate 1 starts to be cut using a drill blade 110. This insertion of the drill blade 110 forms part of the metal substrate 1 into an initial protrusion 112.

Figure 6C:
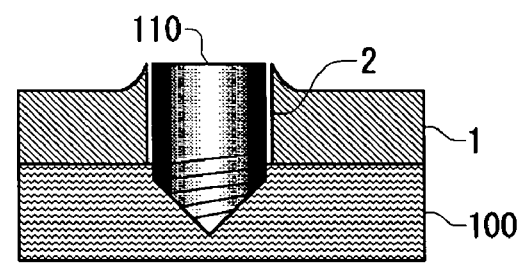

Next, as shown in FIG. 6C, the drill blade 110 pierces through the metal substrate 1 to form a pierced hole 2.

Figure 6D:
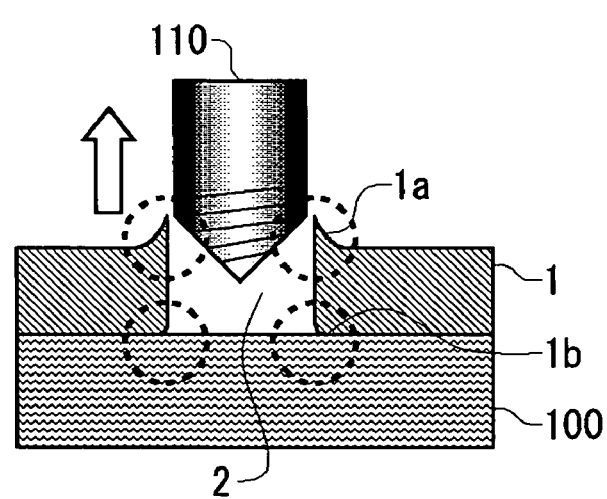

Finally, as shown in FIG. 6D, the drill blade 110 is drawn away from the metal substrate 1, at which time a protrusion 1a is formed on the top of the metal substrate 1 along the end of the pierced hole 2. In the meantime, the metal substrate 1 is pulled by the drawn drill blade 110, so that a depression 1b is formed along the end of the pierced hole 2 opposite to the drill-in surface. It should be noted that the amount of recess of the depression 1b is smaller than the volume of the protrusion 1a since the depression 1b is in contact with the control plate 100. In other words, the metal substrate 1 increases in volume as compared to when the pierced hole 2 is formed in the metal substrate 1 without the protrusion 1a or the depression 1b.

The circuit apparatus in accordance with the foregoing first embodiment provides the following effects.

(1) The protrusions 1 formed along the ends of the pierced holes 2, in which the conductor layer 8 is formed, produce an anchoring effect to fasten the insulating layer 3, which might expand when the circuit board 10 rises in temperature. This can reduce any pattern deviation of the wiring pattern layer 4 (or deformation of the conductor layer 8 which connects the upper and lower wiring pattern layers 4 and 6; more particularly, displacements between the conductor layer 8 inside the pierced holes 2 of the metal substrate 1 and the connecting points to the wiring pattern layer 4) ascribable to the difference between the coefficients of thermal expansion of the metal substrate 1 and the insulating layer 3. Furthermore, the protrusions 1a formed along the ends of the pierced holes 2 in a honeycomb configuration increase the contact area between the metal substrate 1 and the insulating layer 3, providing an improvement in adhesion. This can reduce the exfoliation of the insulating layer 3 from the metal substrate 1. As a result, it is possible to prevent the reliability of the circuit apparatus from being reduced at increasing temperatures.

(2) Since the protrusions 1a are formed selectively on the same side as the LSI chip 20, or heat source, it is possible to more effectively suppress expansion of the insulating layer 3. This can provide improved adhesion. Since the protrusions 1a are formed along the ends of the pierced holes 2 which are arranged in a honeycomb configuration, the protrusions 1a are distributed uniformly within the circuit apparatus. The effect of improved adhesion can thus be obtained uniformly within the circuit apparatus. Furthermore, the honeycomb configuration makes it possible to arrange the plurality of pierced holes 2 with a density higher than in a square grid configuration. This can increase the contact areas of the protrusions 1a to enhance the effect for improving adhesion. As a result, it is possible to more effectively prevent the reliability of the circuit apparatus from being reduced at increasing temperatures.

(3) The interval (distance) between the wiring pattern layer 4, to which the LSI chip 20 is connected, and the metal substrate 1 decreases relatively at locations where the protrusions 1a are formed on the metal substrate 1. The protrusions 1a thus serve as channels for dissipating heat radiating from the LSI chip 20 to the metal substrate 1. As compared to the case where the metal substrate 1 has no protrusion, the circuit apparatus 50 (circuit board 10) has an improved heat dissipation characteristic. As a result, it is possible to improve the reliability of the circuit apparatus at increasing temperatures.

(4) The provision of the protrusions 1a on the metal substrate 1 makes the metal substrate 1 greater in volume, and the heat capacity of the metal substrate 1 increases with the increasing volume of the metal substrate 1. The increase in the volume of the metal substrate 1 can be achieved by making the amounts of increase in volume ascribable to the formation of the protrusions 1a along the ends of the pierced holes 2 on one side greater than the amounts of decrease in volume ascribable to the formation of the depressions 1b along the ends of the pierced holes 2 on the other side.

Second Embodiment

Figure 7:
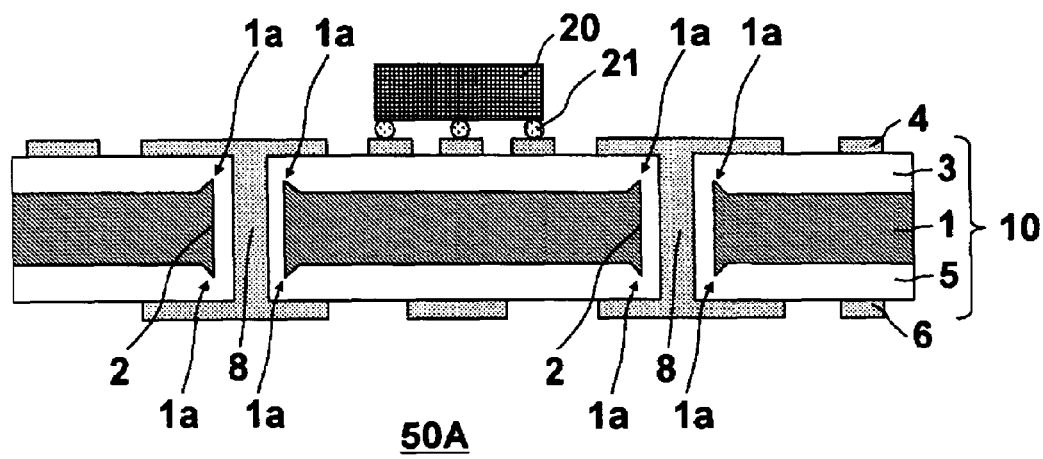
FIG. 7 is a sectional view of a circuit apparatus which has a circuit board including a metal substrate according to a second embodiment of the present invention.

FIG. 7 is a sectional view of a circuit apparatus which has a circuit board including a metal substrate according to a second embodiment of the present invention. In the first embodiment, the protrusions 1a are formed along the ends of the pierced holes 2 on one side of the metal substrate 1 where the LSI chip 20 is mounted. In contrast, in accordance with the present embodiment, the protrusions 1a are formed at the ends of the pierced holes 2 on both sides, not on the one side alone where the LSI chip 20 is mounted. In other respects, the circuit apparatus in accordance with the second embodiment has the same configuration as in the first embodiment.

The protrusions 1a at both ends of the pierced holes 2 of the metal substrate 1 can be formed easily by drilling without using dummy boards, which are typically used to sandwich the work, and are drilled together with the work.

The circuit apparatus in accordance with this second embodiment provides the following effects.

(5) The protrusions 1a are formed at both ends of the pierced holes 2 of the metal substrate 1. Consequently, the protrusions 1a formed at the ends of the pierced holes 2 of the metal substrate 1 can also exert the anchoring effect on the bottom side of the metal substrate 1, thereby fastening the insulating layer 5 that might expand when the circuit apparatus 50A (circuit board 10) rises in temperature. This makes it possible to reduce any pattern deviation of the wiring pattern layer 6 (or deformation of the conductor layer 8 which connects the upper and lower wiring pattern layers 4 and 6; more particularly, displacements between the conductor layer 8 inside the pierced holes 2 of the metal substrate 1 and the connecting points to the wiring pattern layer 6) ascribable to the difference between the coefficients of thermal expansion of the metal substrate 1 and the insulating layer 5. Furthermore, the protrusions 1a formed along the ends of the pierced holes 2 in a honeycomb configuration increase the contact area between the metal substrate 1 and the insulating layer 5, with an improvement in adhesion. This can reduce the exfoliation of the insulating layer 5 from the metal substrate 1. As a result, it is possible to prevent displacements and film exfoliation ascribable to thermal expansion at both sides of the circuit board 10. This can further prevent the reliability of the circuit apparatus 50A (circuit board 10) from being reduced at increasing temperatures.

Modification of Second Embodiment

Figure 8:
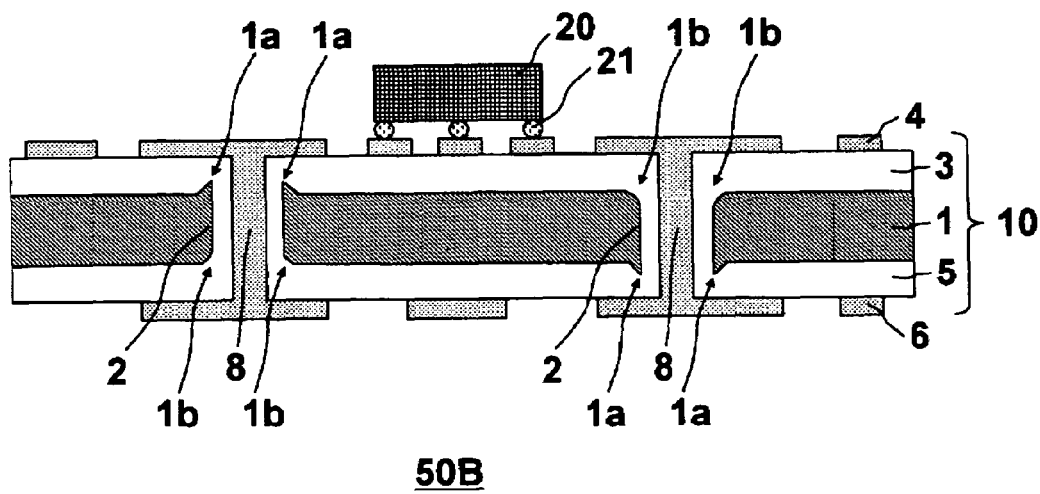
FIG. 8 is a sectional view showing another example of the metal substrate shown in FIG. 7, having protrusions on both sides.

FIG. 8 shows a modification of the second embodiment shown in FIG. 7, in which protrusions are formed on both sides of the metal substrate.

In the second embodiment, the structure where the metal substrate 1 has protrusions 1a on both sides is achieved by forming the protrusions 1a at both ends of each of the pierced holes 2. In a modification of the second embodiment, the protrusions 1a are formed on either one end of each pierced hole 2 (depression 1b on the other end). In other words, some of the pierced holes 2 have their protrusions 1a on the top side of the metal substrate 1, and others have their protrusions 1a on the bottom side of the metal substrate 1. In other respects, the circuit apparatus in accordance with the modification of the second embodiment has the same configuration as in the second embodiment.

The circuit apparatus in accordance with this modification of the second embodiment can also provide the foregoing effect (5), which has already been described in conjunction with the second embodiment.

Third Embodiment

Figure 9:
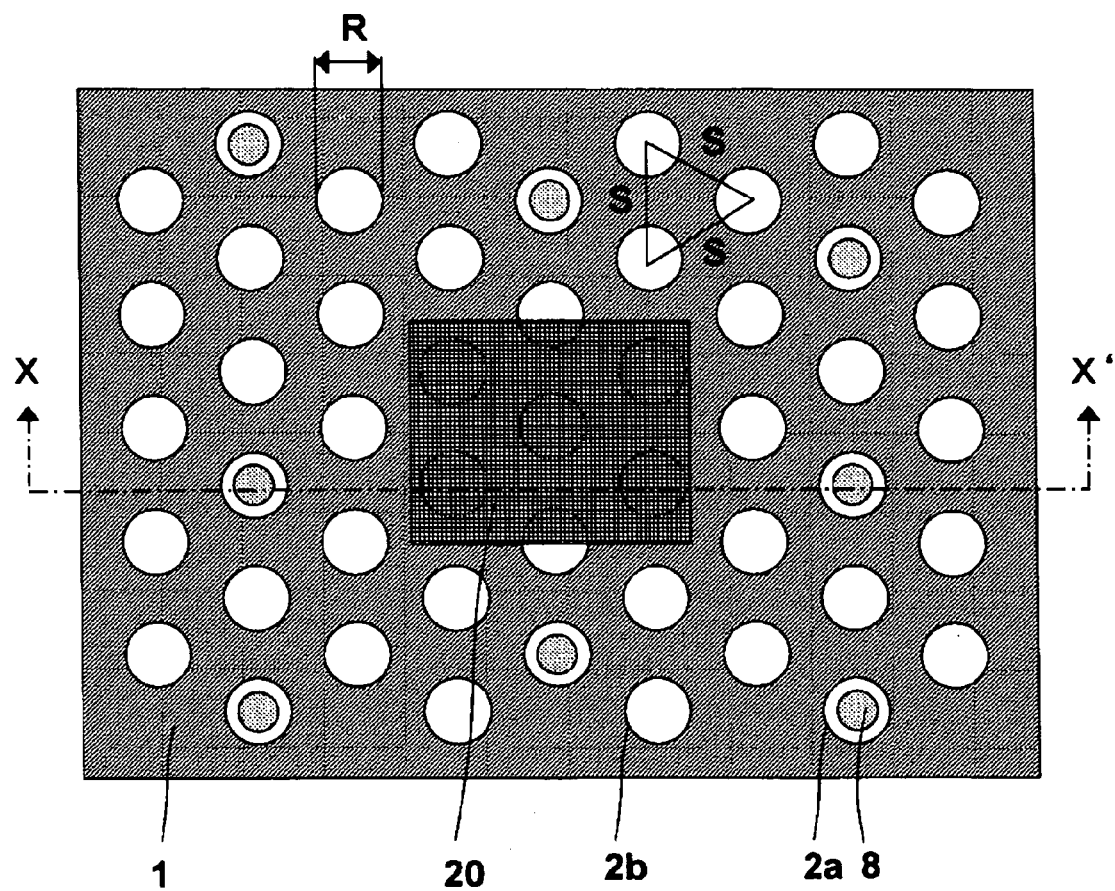
FIG. 9 is a plan view showing the positions of pierced holes formed in the metal substrate of a circuit apparatus according to a third embodiment of the present invention.
Figure 10:
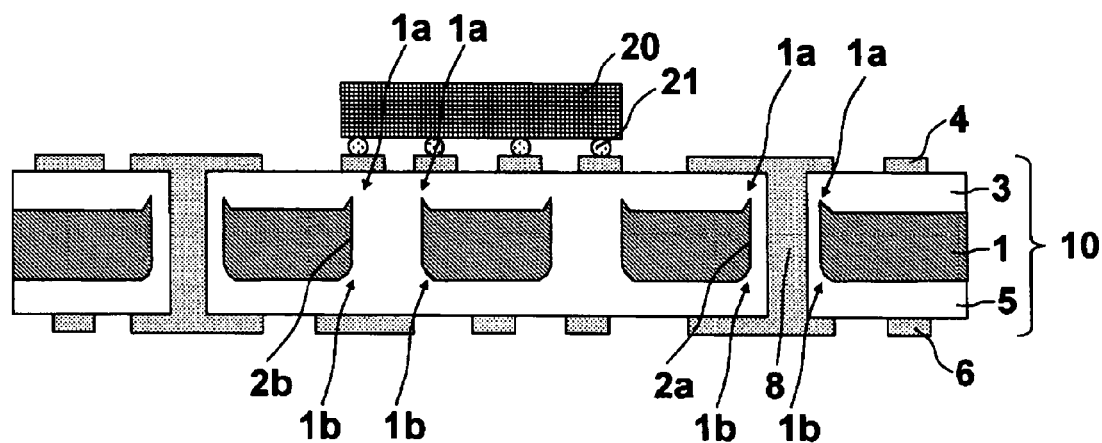
FIG. 10 is a schematic sectional view of the circuit apparatus, taken along the line X-X' of FIG. 9.

FIG. 9 is a plan view showing the positions of pierced holes formed in the metal substrate of a circuit apparatus according to a third embodiment of the present invention. FIG. 10 is a schematic sectional view of the circuit apparatus, taken along the line X-X' of FIG. 9. Differences from the first embodiment consist in the following two points. First, the pierced holes 2 (diameter R: approximately 300 μm) piercing through the metal substrate 1 are formed in a honeycomb configuration of higher density (S=2R, where S is the pitch between pierced holes). Second, the plurality of pierced holes includes pierced holes 2a that are provided with the conductor layer 8 and pierced holes (dummy pierced holes) 2b that are not provided with the conductor layer 8. In other respects, the circuit apparatus in accordance with the third embodiment is the same as that of the foregoing first embodiment.

Specifically, in the foregoing step shown in FIG. 4B, the laser irradiation or drilling is performed selectively so that through holes 7 (approximately 150 μm in diameter) are formed inside pierced holes at desired locations. Subsequently, in the step shown in FIG. 4C, copper plating is performed to fill the corresponding locations with the conductor layer 8. Consequently, the pierced holes 2a having the conductor layer 8 and the pierced holes (dummy pierced holes) 2b not having the conductor layer 8 are selectively formed in the circuit board. In the third embodiment, the pierced holes (dummy pierced holes) 2b not having the conductor layer 8 are formed more than the pierced holes 2a having the conductor layer 8. Furthermore, the pierced holes (dummy pierced holes) 2b not having the conductor layer 8 are arranged to surround the pierced holes 2a having the conductor layer 8.

This circuit apparatus in accordance with the third embodiment provides the following effects in addition to the above effects (1) to (4) described in the foregoing first embodiment.

(6) The honeycomb configuration of the pierced holes in the metal substrate 1, including the pierced holes 2b not having the conductor layer 8, facilitates design and layout as compared to the honeycomb configuration that only includes the pierced holes 2a having the conductor layer 8. This allows for a reduction in cost of the circuit apparatus.

(7) The honeycomb configuration of the pierced holes in the metal substrate 1, including the pierced holes 2b not having the conductor layer 8, makes it possible to form the pierced holes in the metal substrate 1 with a density higher than in the honeycomb configuration that only includes the pierced holes 2a having the conductor layer 8. This can enhance the foregoing effect (2).

(8) The conductor layer 8 is formed by making through holes 7 in desired locations of the metal substrate 1 which has the pierced holes in a honeycomb configuration. The layout and design for making pierced holes in the metal substrate 1 can be made standardized, so that the metal substrate 1 can be used for a plurality of different models of circuit apparatuses. This allows cost reduction of each of the circuit apparatuses.

(9) In plan view, the pierced holes 2b not having the conductor layer 8 are arranged so as to surround the pierced holes 2a having the conductor layer 8. The expansion of the insulating layer 3 in the vicinity of the pierced holes 2a can thus be suppressed further by the protrusions formed along the ends of the pierced holes 2a arranged around such. This makes it possible to reduce the pattern shift of the wiring pattern layer 4 in the pierced holes 2a further.

Fourth Embodiment

Figure 11:
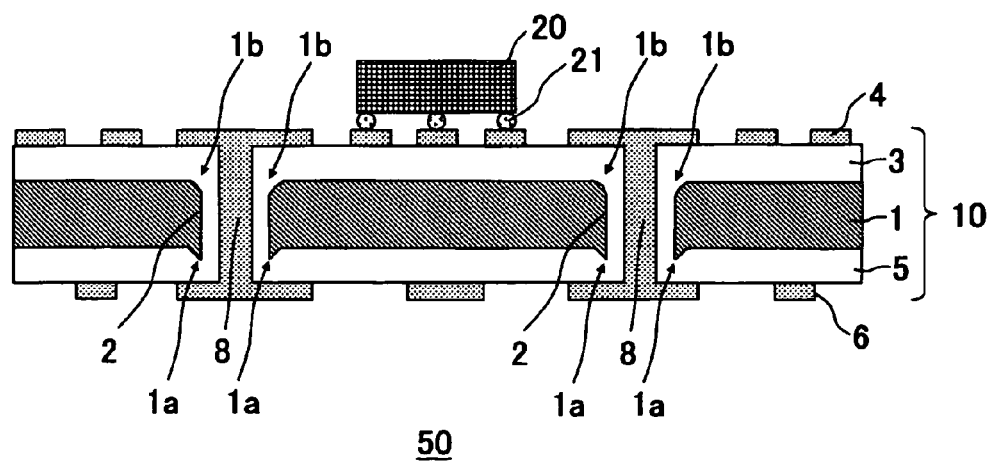
FIG. 11 is a sectional view of a circuit apparatus which has a circuit board including a metal substrate according to a fourth embodiment of the present invention.

FIG. 11 is a sectional view of a circuit apparatus which has a circuit board including a metal substrate according to a fourth embodiment of the present invention.

The circuit apparatus 50 in accordance with the fourth embodiment of the present invention has a circuit board 10, in which a metal substrate 1 having pierced holes 2 is formed as a core member. The metal substrate 1 has protrusions 1a at the bottom ends of the pierced holes 2, and depressions 1b at the top ends of the pierced holes 2. Wiring pattern layers 4 and 6 are formed on both sides of this metal substrate 1 via insulating layers 3 and 5, respectively. For electrical connection between the wiring pattern layers, a conductor layer 8 for connecting the wiring pattern layer 4 and the wiring pattern layer 6 is formed through the metal substrate 1 via the pierced holes 2. The conductor layer 8 thereby establishes electrical conduction between the wiring pattern layers. Moreover, a semiconductor chip 20 is directly connected to the top side of the circuit board 10 via solder balls 21.

Specifically, a metal substrate 1 having a thickness of approximately 50 μm to 1 mm (for example, approximately 100 μm) is used as the core member inside the circuit board 10 in the circuit apparatus 50 in accordance with the fourth embodiment. For example, this metal substrate 1 is made of a cladding material that is formed by laminating the following layers: a lower metal layer of copper; an intermediate metal layer of Fe—Ni alloy (so-called invar alloy) formed on the lower metal layer; and an upper metal layer of copper formed on the intermediate metal layer. It should be appreciated that the metal substrate 1 may be made of a single layer of copper.

The metal substrate 1 is shaped by laser irradiation or drilling so that pierced holes 2 (approximately 300 μm in diameter) piercing through the metal substrate 1 are formed in predetermined locations of the metal substrate 1. This consequently forms the protrusions 1a (approximately 25 μm) at the ends of the pierced holes 2a on the bottom side of the metal substrate 1, and the depressions 1b at the ends of the pierced holes 2 on the top side. If ten or more pierced holes 2 are formed, for example, in every 100 mm$^2$ of the metal substrate 1, it is possible to prevent effectively the reliability of a circuit board (to be described later) and a circuit apparatus using the same from reduced.

The insulating layers 3 and 5 on the top side and bottom side of the metal substrate 1 are made primarily of an epoxy resin, with a thickness of approximately 60 μm to 160 μm (for example, approximately 75 μm). The pierced holes 2 of the metal substrate 1 are completely filled with the insulating layers 3 and 5. A filler of approximately 2 μm to 10 μm in diameter may be added to the insulating layers 3 and 5, which consist primarily of the epoxy resin. Examples of this filler may include alumina ($Al_2O_3$), silica ($SiO_2$), aluminum nitride (AlN), silicon nitride ($Si_3N_4$), and boron nitride (BN). The filling rate of the filler is approximately 60% to 80% by weight.

The wiring pattern layers 4 and 6 of copper, having a thickness of approximately 35 μm, are formed on the insulating layers 3 and 5, respectively. The conductor layer 8 (approximately 150 μm in diameter) establishes electrical conduction between the wiring pattern layers. Here, the wiring pattern layer 6 on the bottom side has a wiring density of about 30%, and the wiring pattern layer 4 on the top side has a wiring density of around 50%. The LSI chip, or semiconductor chip 20, is connected onto the wiring pattern layer 4 via the solder balls 21. It should be appreciated that the wiring density refers to the areal ratio of wiring in a predetermined area.

FIGS. 12A to 14 are sectional views for explaining the manufacturing process of the circuit apparatus including the circuit board in accordance with the fourth embodiment of the present invention shown in FIG. 11.

Figure 12A:
FIGS. 12A to 12C are sectional views for explaining the process for manufacturing the circuit apparatus which has the circuit board including the metal substrate according to the fourth embodiment of the present invention.

Initially, as shown in FIG. 12A, a metal substrate 1 having a thickness of approximately 50 μm to 1 mm (for example, approximately 100 μm) is prepared as a core member. For example, this metal substrate 1 is made of a cladding material that is formed by laminating the following layers: a lower metal layer of copper; an intermediate metal layer of Fe—Ni alloy (so-called invar alloy) formed on the lower metal layer; and an upper metal layer of copper formed on the intermediate metal layer. The metal substrate 1 may be made of a single layer of copper.

Figure 12B:
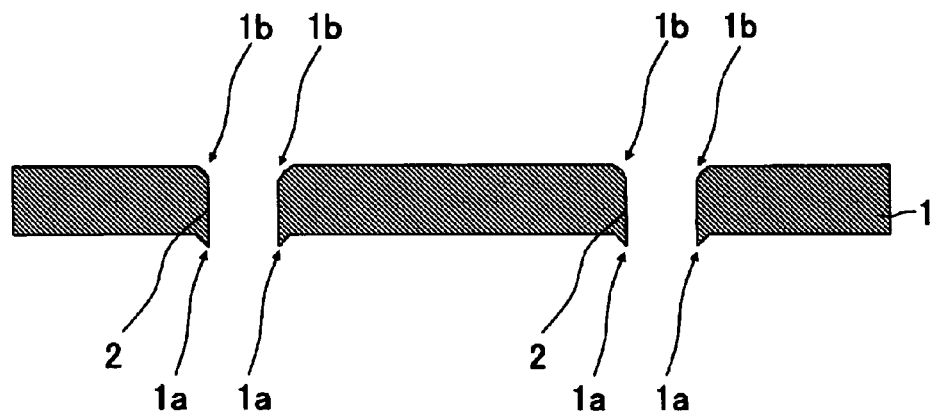

Next, as shown in FIG. 12B, the metal substrate 1 is irradiated with a laser or drilled from below, whereby pierced holes 2 (approximately 300 μm in diameter) piercing through the metal substrate 1 are formed at predetermined locations. Consequently, protrusions 1a (approximately 25 μm in height) are formed at the bottom ends of the pierced holes 2 of the metal substrate 1, and depressions 1b are formed at the top ends of the pierced holes 2. While these protrusions 1a are formed along the ends of the pierced holes 2 of the metal substrate 1, the extremities of the protrusions 1a need not be of a uniform height. For example, the extremities may have a comb-like or wave-like configuration. It should be appreciated that the protrusions need not be identical in shape or height either. If ten or more protrusions 1a (pierced holes 2) are formed, for example, in every 100 mm$^2$ of the metal substrate 1, it is possible to reduce the stress load occurring due to a difference between the wiring densities of the wiring pattern layers. This makes it possible to provide a circuit board having high reliability and a circuit apparatus using the same. The pierced holes 2 are preferably formed uniformly across the entire area of the metal substrate 1.

Figure 12C:
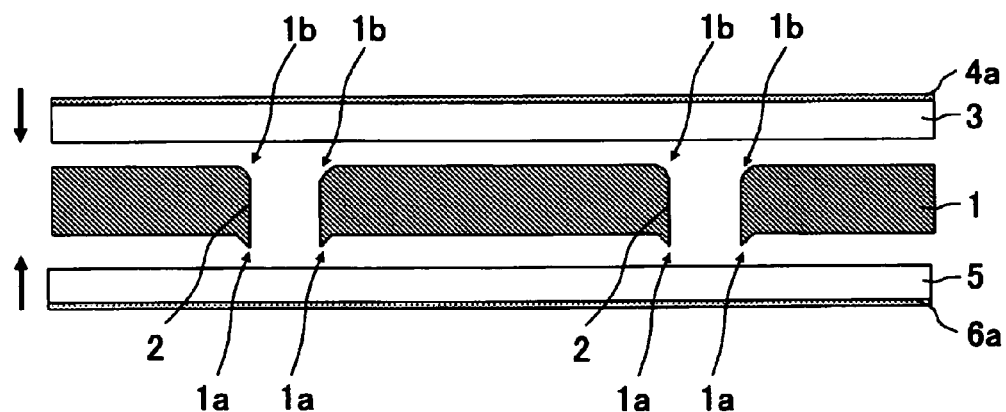

Next, as shown in FIG. 12C, an insulating layer 3 accompanied with a copper foil 4a, and an insulating layer 5 accompanied with a copper foil 6a, are thermocompression bonded to the top side and bottom side of the metal substrate 1, respectively, under vacuum or reduced pressure. For example, the insulating layers 3 and 5 have a thickness of about 75 μm, and the copper foils 4a and 6a have a thickness of about 10 μm to 15 μm.

Figure 13A:
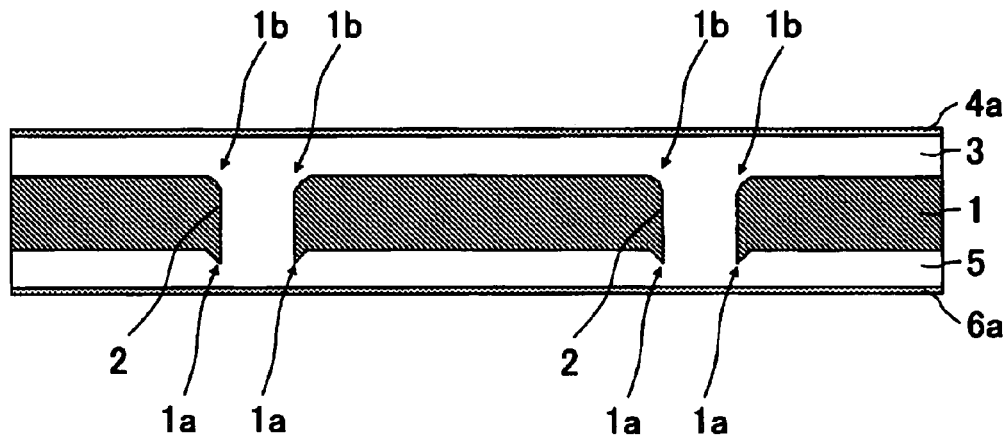
FIGS. 13A to 13C are sectional views for explaining the process for manufacturing the circuit apparatus which has the circuit board including the metal substrate according to the fourth embodiment of the present invention.

After the compression bonding of the copper-foiled insulating layers, as shown in FIG. 13A, the pierced holes 2 of the metal substrate 1 are completely filled with the insulating layers 3 and 5.

Figure 13B:
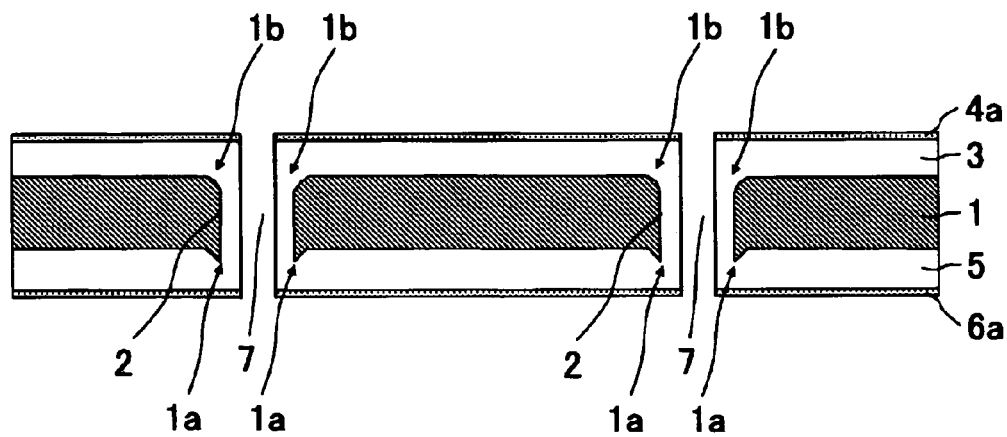

Next, as shown in FIG. 13B, the metal substrate 1 is irradiated with a laser or drilled from below, whereby through holes 7 (approximately 150 μm in diameter) for connecting the copper foils on both sides are formed at locations corresponding to the pierced holes 2.

Figure 13C:
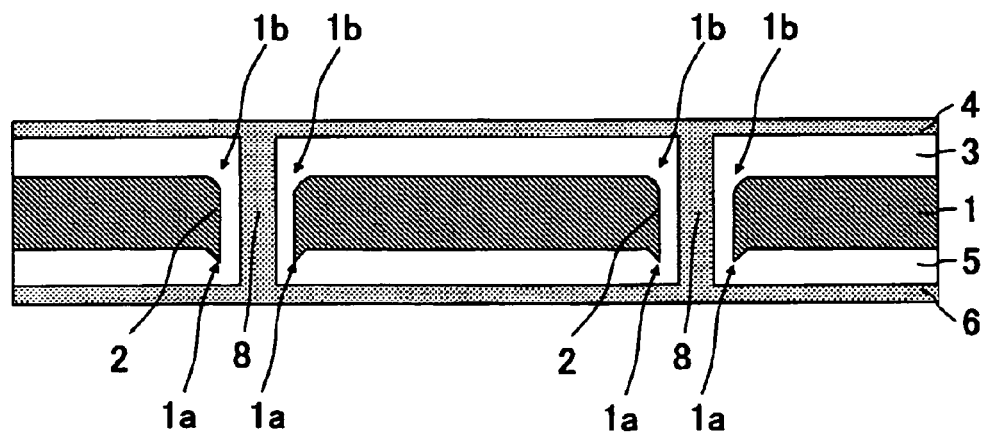

Next, as shown in FIG. 13C, the top surface of the copper foil 4a, the inner surfaces of the through holes 7, and the bottom surface of the copper foil 6a are plated with approximately 0.5 μm of copper by electroless plating. Subsequently, the top surface of the copper foil 4a, the inner surfaces of the through holes 7, and the bottom surface of the copper foil 6a are plated by electrolytic plating. In the fourth embodiment of the present invention, an inhibitor and a promoter are added to the plating solution, so that the inhibitor is absorbed onto the surfaces of the copper foils 4a and 6a while the promoter is absorbed onto the inner surfaces of the through holes 7. This can increase the thickness of the copper plating on the inner surfaces of the through holes 7, thereby filling the through holes 7 with copper. As a result, wiring layers 4 and 6 of copper, having a thickness of approximately 35 μm, are formed on the insulating layers 3 and 5, respectively. The through holes 7 are filled with a conductor layer 8 of copper.

Figure 14:
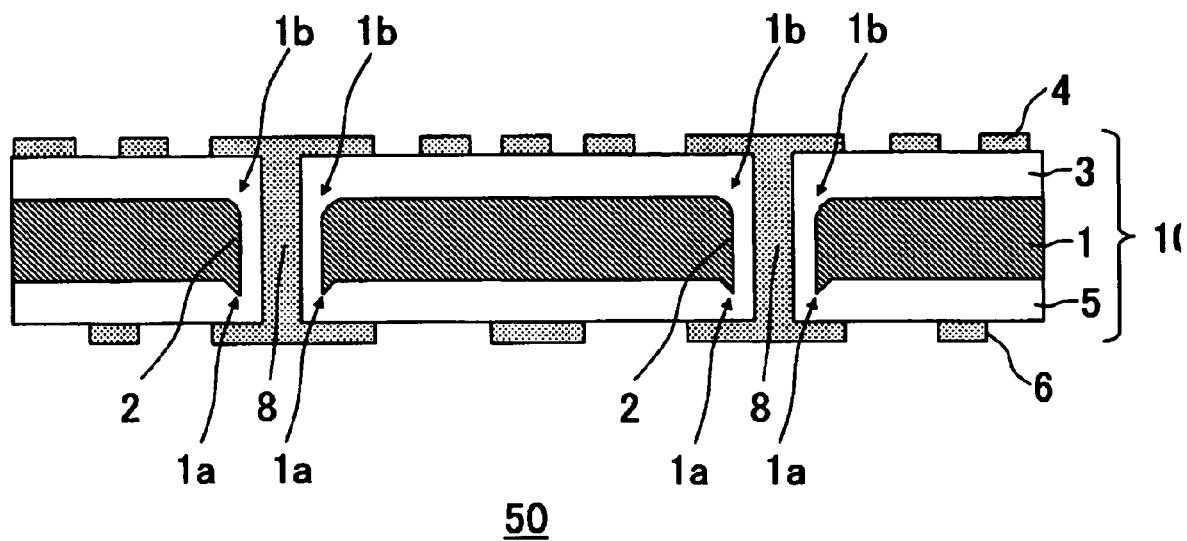
FIG. 14 is a sectional view for explaining the process for manufacturing the circuit apparatus which has the circuit board including the metal substrate according to the fourth embodiment of the present invention.

Next, as shown in FIG. 14, the wiring layers 4 and 6 are individually patterned using ordinary photolithography and etching techniques. This forms the wiring pattern layer 4 and the wiring pattern layer 6. Here, the wiring density on the side where the protrusions 1a are formed is lower than on the opposite side. The difference between the wiring densities is approximately 10% or higher. The circuit board 10, which includes the metal substrate 1 having the protrusions 1a, is formed thus.

Finally, as shown in FIG. 11, the LSI chip 20 is mounted on the wiring pattern layer 4 of the circuit board 10 so as to make electrical connection via the solder balls 21. The LSI 20 is then fixed with a resin layer (not shown). As a result, the circuit apparatus 50, which has the circuit board 10 including the metal substrate 1, is formed.

In accordance with the fourth embodiment, the protrusions 1a are formed at the ends of the pierced holes 2 of the metal substrate 1 as described above. Due to differences in the coefficient of thermal expansion, tensile stresses act between the metal substrate 1 and the insulating layers 3 and 5 (forces which cause the insulating layers expand). Under normal conditions, the tensile stress between the metal substrate 1 and the insulating layer 3, and the tensile stress between the metal substrate 1 and the insulating layer 5, are roughly balanced with each other. The expansion of the insulating layer 5 is suppressed to be smaller than that of the insulating layer 3, however, since the expansion is limited by the anchoring effect of the protrusions 1a which are formed to bite into the insulating layer 5. This puts the tensile stresses occurring from the respective insulating layers out of balance, so that the difference between the tensile stresses of the insulating layers 3 and 5 acts on the circuit board 10. The difference in tensile stress can ease the compression stress ascribable to a difference between the wiring densities of the wiring pattern layers formed on the circuit board 10 (with the compression stress acting on the side of the wiring pattern layer 4). This makes it possible to avoid warpage of the circuit board 10, and suppress the occurrence of wiring migration and exfoliation of the insulating layers due to compression stresses acting on the circuit board 10. Furthermore, it is possible to preclude transportation errors when packaging the circuit element 20, with an improvement in the reliability of the circuit board 10 including the metal substrate 1.

The protrusions 1a formed along the ends of the pierced holes 2 also provide the structure that the metal substrate 1 is reinforced with from the bottom side, thereby increasing the resistance (bending resistance) of the metal substrate 1 against warpage and deformation. As a result, warpage and deformation of the circuit board 10 are suppressed even when the circuit board 10 is put under a stress load (compression load acting on the side of the wiring pattern layer 4).

In the fourth embodiment, the circuit element 20 is arranged on the circuit board 10. The circuit element 20, or heat source, raises the temperature of the circuit board 10 (circuit apparatus) 50, thereby making it easier for the insulating films 3 and 5 to expand. Nevertheless, since the expansion of the insulating layer 5 is limited by the protrusions 1a, the difference between the amounts of expansion of the insulating layers 3 and 5 widens to increase the tensile stress ascribable to the insulating layers. This can reduce the compression stress occurring due to the difference in the wiring density, so that warpage and deformation of the circuit board 10 can be suppressed for improved reliability of the circuit apparatus 50.

Moreover, if the circuit element 20 is arranged so as to cover pierced holes 2, the difference between the amounts of expansion of the insulating layers 3 and 5 widens to increase the tensile stress ascribable to the insulating layers further. Warpage and deformation of the circuit board 10 can thus be effectively suppressed.

Furthermore, in accordance with the fourth embodiment, the circuit element 20 is arranged on the wiring pattern layer 4 opposite to the protrusions 1a. Since the insulating layer 3 closer to the circuit element 20 expands more easily due to the heat generated by the circuit element 20, a greater tensile stress occurs due to the difference in expansion between the insulating layers. This allows a further reduction in the compression stress ascribable to the difference in the wiring density. It is therefore possible to suppress warpage and deformation of the circuit board 10 further, and provide a circuit apparatus of improved reliability.

Modification of Fourth Embodiment

Figure 15:
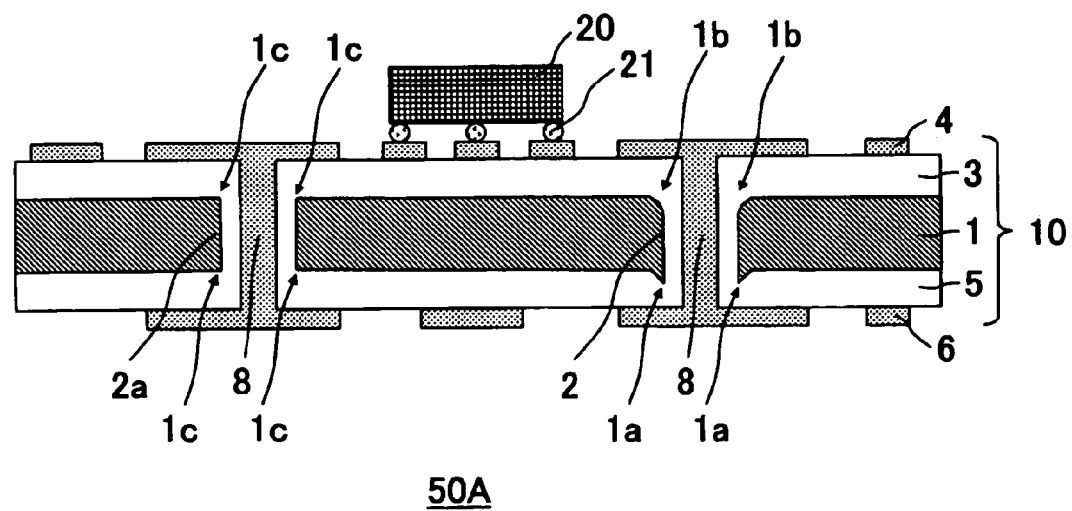
FIG. 15 is a sectional view of a circuit apparatus which has a circuit board including a metal substrate according to a modification of the fourth embodiment of the present invention.

FIG. 15 is a sectional view of a circuit apparatus which has a circuit board including the metal substrate according to a modification of the fourth embodiment of the present invention. In the modification of the fourth embodiment, not all the pierced holes 2 of the metal substrate 1 are provided with protrusions 1a at their ends. Some pierced holes 2a (ends 1c) are not provided with any protrusion. In other respects, the circuit apparatus is the same as in the fourth embodiment.

Even in the modification of the fourth embodiment, the protrusions 1a formed at the ends of pierced holes of the metal substrate 1 can not only reduce the compression stress ascribable to the wiring densities of the wiring pattern layers as in the fourth embodiment, but also suppress warpage and deformation of the metal substrate 1 due to the compression stress. It is therefore possible to provide a circuit board 10 that has the metal substrate 1 of high reliability, and a circuit apparatus 50A using the same.

Fifth Embodiment

Figure 16:
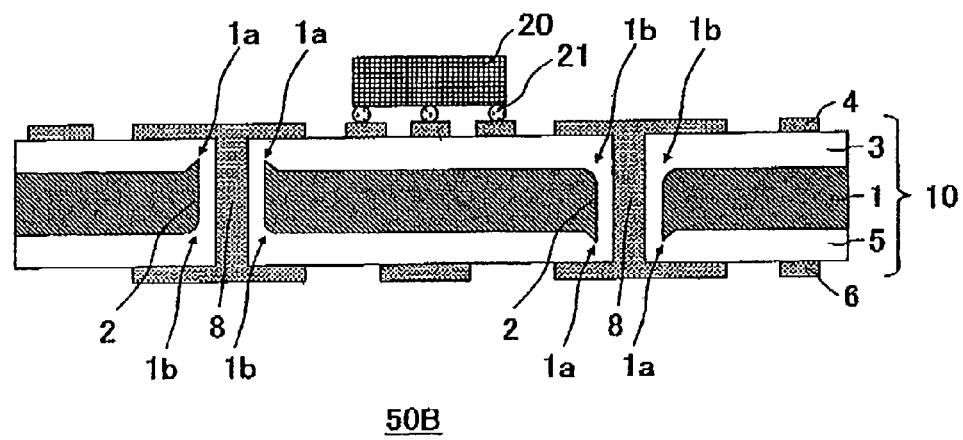
FIG. 16 is a sectional view of a circuit apparatus which has a circuit board including a metal substrate according to a fifth embodiment of the present invention.
Figure 17:
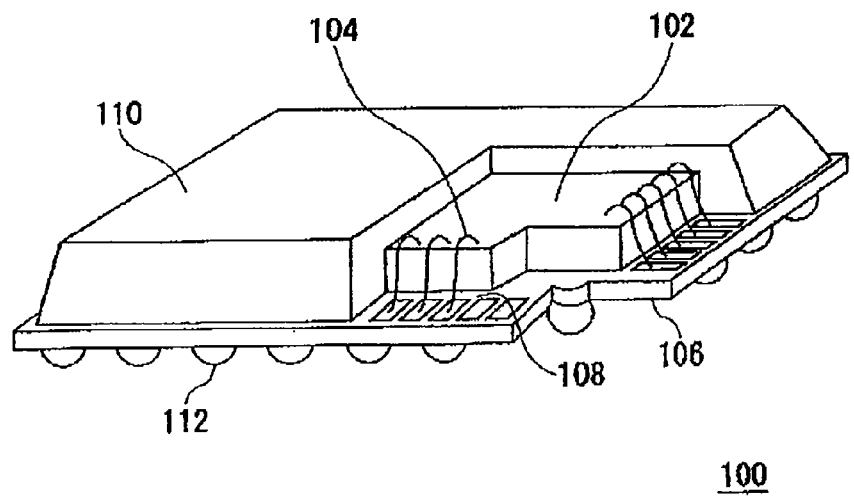
FIG. 17 is a diagram for explaining the general configuration of a conventional typical BGA.
Figure 18:
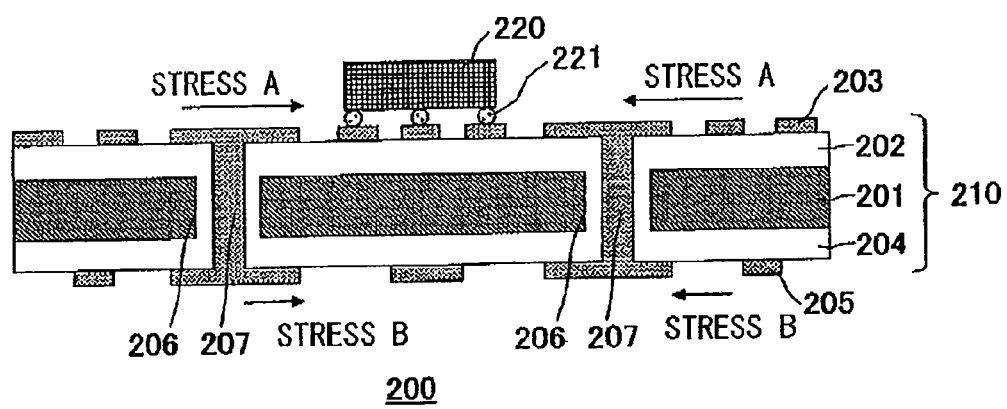
FIG. 18 is a sectional view schematically showing the structure of a circuit apparatus which has a circuit board including a conventional metal substrate.
Figure 19:
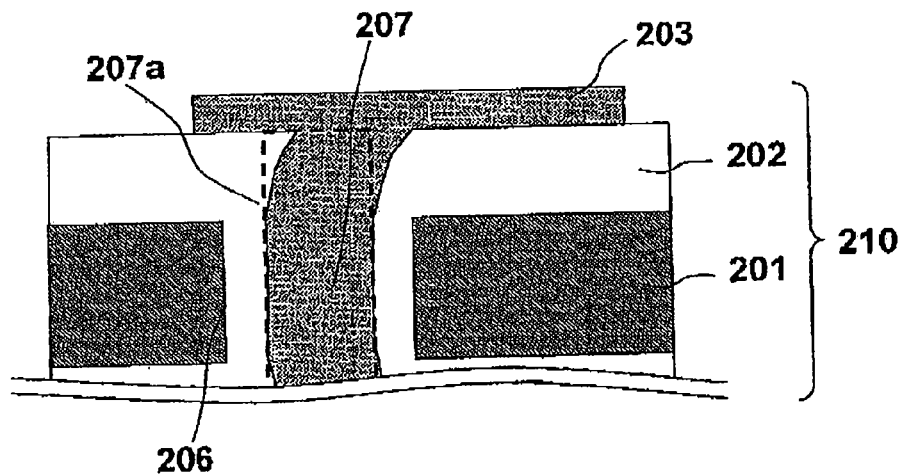
FIG. 19 is a sectional view of the circuit apparatus having the conventional metal substrate, undergoing a displacement due to a rise in temperature.
Figure 20:
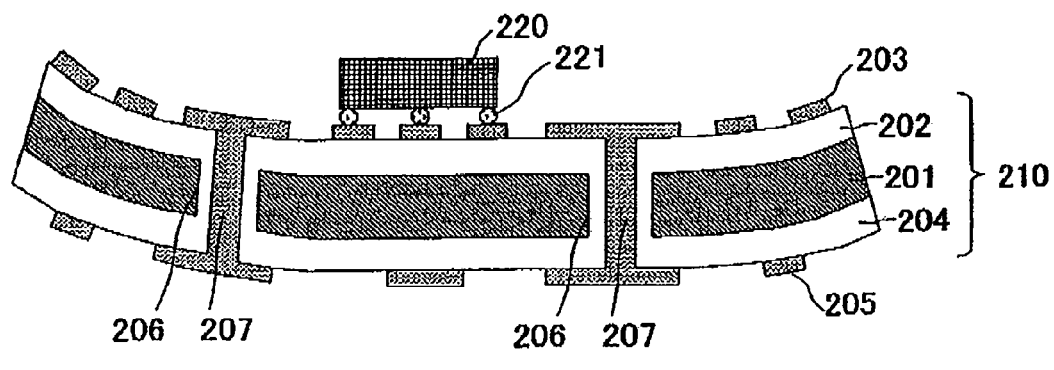
FIG. 20 is a sectional view of a circuit apparatus having the conventional metal substrate, in which the circuit board is deformed.

FIG. 16 is a sectional view of a circuit apparatus which has a circuit board including a metal substrate according to a fifth embodiment of the present invention. A difference of the fifth embodiment from the fourth embodiment consists in that the protrusions 1a of the pierced holes 2 (the depressions 1b on the other side) are formed on both the top and bottom sides of the metal substrate 1, not only on the bottom side of the metal substrate 1. While the diagram shows one protrusion on the top side and one on the bottom side, protrusions are in fact formed more on the bottom side than on the top side. In other respects, the circuit apparatus is the same as in the fourth embodiment.

In accordance with the fifth embodiment, the number of protrusions 1a formed on the top side of the metal substrate 1 is greater than the number of protrusions 1a formed on the bottom side of the same. The protrusions 1a thus limit the expansion of the insulating layer 5 on the bottom side more firmly than that of the insulating layer 3 on the top side. Consequently, as in the fourth embodiment, the compression stress ascribable to the wiring densities of the wiring pattern layers is reduced for improved reliability of the circuit apparatus 50B.

It should be appreciated that the embodiments disclosed herein are to be considered in all respects as illustrative and not restrictive. The scope of the present invention shall be indicated not by the description of the foregoing embodiments but by the appended claims, and all modifications which move within the meaning and range of equivalency of the claims are therefore intended to be embraced therein.

For example, the foregoing embodiments have dealt with the cases where the present invention is applied to a circuit apparatus on which an LSI chip is mounted. Nevertheless, the present invention is not limited thereto, but may also be applied to circuit apparatuses on which circuit elements other than LSI chips are mounted. For example, capacitors, resistors, and other passive elements are also applicable.

Moreover, the foregoing embodiments have dealt with the cases where the present invention is applied to a circuit board of double-layered wiring structure, and a circuit apparatus using the same, in which an insulating layer and a wiring layer are formed in succession on both sides of the metal substrate. Nevertheless, the present invention is not limited thereto, but may be applied to circuit boards of four-layered wiring structure, and circuit apparatuses using the same, in which additional insulating layers and wiring layers are formed in succession. The present invention may also be applied to circuit boards of multilayer structure with six or more layers, and circuit apparatuses using the same.

The foregoing third embodiment has dealt with the case where the protrusions 1a are formed along the ends of the pierced holes 2 of the metal substrate 1 only on the side where the LSI chip 20 is mounted. Nevertheless, the protrusions 1a may be formed on both sides of the pierced holes 2 of the metal substrate 1. In this case, the foregoing effect (5) of the second embodiment becomes available.

The foregoing first and second embodiments have dealt with the cases where the conductor layer 8 is formed in all the pierced holes 2 of the metal substrate 1. Nevertheless, the conductor layer 8 may be formed in necessary locations alone, and not at all the pierced holes 2. In this case, the foregoing effects (6) and (8) of the third embodiment become achievable.

The foregoing embodiments have dealt with the cases where the metal substrate 1 is provided with the pierced holes 2 of honeycomb configuration. However, the present invention is not limited thereto. A plurality of pierced holes 2 may be formed in a square grid configuration. Otherwise, a plurality of pierced holes 2 may be formed in a random pattern without causing problems in design.

The modification of the foregoing second embodiment has dealt with the case where pierced holes 2 having protrusions 1a on either one side of the metal substrate 1 (depressions 1b on the other side) are formed both upward and downward. When such protrusions 1a are formed more on the top side of the metal substrate 1 than on the bottom side, it follows that the greater number of protrusions 1a lies on the same side as the LSI chip 20, or heat source. This makes it possible to exercise the adhesion-improving effect more efficiently.

The foregoing embodiments have dealt with the cases of using a metal substrate. The substrate may be made of resin, however, as long as protrusions can be formed thereon by laser irradiation or drilling.

What is claimed is:

1. A circuit apparatus comprising:
   a metal substrate having a plurality of pierced holes;
   a first wiring layer formed on one side of the metal substrate via a first insulating layer;
   a second wiring layer formed on the other side of the metal substrate via a second insulating layer;
   a conductor layer formed in at least some of the plurality of pierced holes so as to pierce through the metal substrate via the pierced holes, thereby establishing connection between the first wiring layer and the second wiring layer; and
   a circuit element connected to the first wiring layer on the one side of the metal substrate, and
   wherein protrusions are formed on the surface of the metal substrate at least along either one end of each of the pierced holes provided with the conductor layer so as to protrude in a convex manner from the surface of the metal substrate.

2. The circuit apparatus according to claim 1, wherein the pierced holes having the conductor layer are formed in a honeycomb configuration within the area of the metal substrate.

3. The circuit apparatus according to claim 1, wherein the protrusions are formed more on the surface of the metal substrate on the one side than on the surface of the metal substrate on the other side.

4. The circuit apparatus according to claim 2, wherein the protrusions are formed more on the surface of the metal substrate on the one side than on the surface of the metal substrate on the other side.

5. The circuit apparatus according to claim 2, wherein the protrusions are selectively formed on the surface of the metal substrate on the one side.

6. The circuit apparatus according to claim 3, wherein the protrusions are selectively formed on the surface of the metal substrate on the one side.

7. The circuit apparatus according to claim 5, wherein the plurality of pierced holes are arranged so that, in plan view, pierced holes not having the conductor layer surround the pierced holes having the conductor layer.

8. The circuit apparatus according to claim 6, wherein the plurality of pierced holes are arranged so that, in plan view, pierced holes not having the conductor layer surround the pierced holes having the conductor layer.

9. The circuit apparatus according to claim 1, wherein: the pierced holes are recessed at their respective ends opposite to the side where the protrusions are formed; and an amount of increase in volume ascribable to the protrusions is greater than an amount of decrease in volume ascribable to the recesses.

10. A circuit board comprising:
    a metal substrate having a plurality of pierced holes;
    a first wiring layer formed on one side of the metal substrate via a first insulating layer;
    a second wiring layer formed on the other side of the metal substrate via a second insulating layer, with a wiring density lower than that of the first wiring layer;
    a conductor layer piercing through the metal substrate via the pierced holes, thereby establishing connection between the first wiring Layer and the second wiring layer; and
    protrusions formed on the other side of the metal substrate along the ends of the pierced holes so as to protrude in a convex manner from the surface of the metal substrate.

11. The circuit board according to claim 10, further comprising protrusions formed on the one side of the metal substrate along the ends of pierced holes, and
    wherein the number of protrusions on the other side of the metal substrate is greater than the number of protrusions on the one side of the metal substrate.

12. A circuit apparatus comprising:
    the circuit board according to claim 10; and
    a circuit element mounted on the circuit board.

13. A circuit apparatus comprising:
    the circuit board according to claim 11; and
    a circuit element mounted on the circuit board.

14. The circuit apparatus according to claim 12, wherein the circuit element is formed on the first wiring layer, opposite to the protrusions.

15. The circuit apparatus according to claim 13, wherein the circuit element is formed on the first wiring layer, opposite to the protrusions.

* * * * *